(12) United States Patent
Ham et al.

(10) Patent No.: US 12,165,949 B2
(45) Date of Patent: *Dec. 10, 2024

(54) DISPLAY DEVICE

(71) Applicant: Samsung Display Co., Ltd., Yongin-si (KR)

(72) Inventors: Munsik Ham, Cheonan-si (KR); Yunjae Kim, Cheonan-si (KR); Jin Yong Sim, Seongnam-si (KR); Bugyoon Yoo, Hwaseong-si (KR); Joonhyuk Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/468,287

(22) Filed: Sep. 15, 2023

(65) Prior Publication Data

US 2024/0006265 A1 Jan. 4, 2024

Related U.S. Application Data

(63) Continuation of application No. 17/317,290, filed on May 11, 2021, now Pat. No. 11,791,235.

(30) Foreign Application Priority Data

Aug. 19, 2020 (KR) .......................... 10-2020-0104065

(51) Int. Cl.
*H01L 23/373* (2006.01)
*H01L 25/18* (2023.01)

(52) U.S. Cl.
CPC .......... *H01L 23/3735* (2013.01); *H01L 25/18* (2013.01)

(58) Field of Classification Search
CPC . H01L 51/5008; H01L 51/0097; H01L 51/50; H01L 51/5246; H01L 51/5253;
(Continued)

(56) References Cited

U.S. PATENT DOCUMENTS 8,314,785 B2  11/2012 Kim et al.
11,087,110 B2  8/2021 Park et al.
(Continued)

FOREIGN PATENT DOCUMENTS

CN  110060574  7/2019
CN  110060574 A  *  7/2019 ............. G09F 9/301
(Continued)

OTHER PUBLICATIONS

CN-110060574-A English Translation (Year: 2019).*
Extended European search report for European Patent Application or Patent No. 21189829.1 dated Dec. 23, 2021.

*Primary Examiner* — Amir A Jalali
(74) *Attorney, Agent, or Firm* — KILE PARK REED & HOUTTEMAN PLLC

(57) ABSTRACT

A display device includes a display panel including a first area, a bending area, and a second area, and comprising a plurality of pixels disposed in the first area, a driving chip disposed on an upper surface of the second area of the display panel and electrically connected to the plurality of pixels, a support layer disposed on a lower surface of the first area of the display panel, and a spacer disposed on the lower surface of the first area and overlapping the support layer in a plan view, wherein the spacer comprises an upper layer, a lower layer, and a base layer having a thermal conductivity greater than a thermal conductivity of the upper layer and a thermal conductivity of the lower layer, and in case that the bending area of the display panel is folded, the spacer overlaps the driving chip in a plan view.

12 Claims, 15 Drawing Sheets

(58) Field of Classification Search
CPC ... H01L 51/529; H01L 27/1248; H01L 27/32; H01L 27/326; H01L 27/3234; H01L 27/3258; H01L 23/367; H01L 23/3192; H01L 23/373; H01L 23/3735; H01L 25/18; G02F 1/133305; G02F 1/133345; G02F 1/133354; G02F 1/133382; G02F 1/133628; G02F 2202/28; G06F 1/1652; G06F 1/203; H05K 1/028
See application file for complete search history.

(56) References Cited

U.S. PATENT DOCUMENTS

| | | |
|---|---|---|
| 2007/0230132 A1 | 10/2007 | Lee |
| 2016/0072094 A1* | 3/2016 | Kim ................. H10K 50/87 315/112 |
| 2018/0166652 A1* | 6/2018 | Kim ................. B32B 27/28 |
| 2019/0006444 A1 | 1/2019 | Nishimura |
| 2019/0051858 A1 | 2/2019 | Tomioka et al. |
| 2019/0096913 A1 | 3/2019 | Lee et al. |
| 2019/0207130 A1 | 7/2019 | He et al. |
| 2019/0340959 A1* | 11/2019 | Park ................. H10K 71/00 |
| 2020/0022261 A1 | 1/2020 | Choi |
| 2021/0150944 A1 | 5/2021 | Yoon et al. |
| 2021/0175462 A1 | 6/2021 | Shin et al. |
| 2021/0249613 A1 | 8/2021 | Kwon et al. |
| 2021/0255367 A1* | 8/2021 | Kim ................. G02B 1/11 |
| 2021/0255665 A1* | 8/2021 | Yoo ................. H04M 1/0216 |
| 2021/0256882 A1* | 8/2021 | Kim ................. G06F 1/1656 |
| 2021/0368621 A1* | 11/2021 | Yoo ................. G06F 1/1686 |
| 2021/0399076 A1 | 12/2021 | Lee et al. |
| 2022/0048272 A1* | 2/2022 | Kang ................. B32B 15/20 |

FOREIGN PATENT DOCUMENTS

| | | |
|---|---|---|
| CN | 110459136 | 11/2019 |
| EP | 3 564 778 | 11/2019 |
| KR | 10-1072970 | 10/2011 |
| KR | 10-1142941 | 5/2012 |
| KR | 10-2052470 | 12/2019 |
| KR | 10-2093497 | 3/2020 |

* cited by examiner

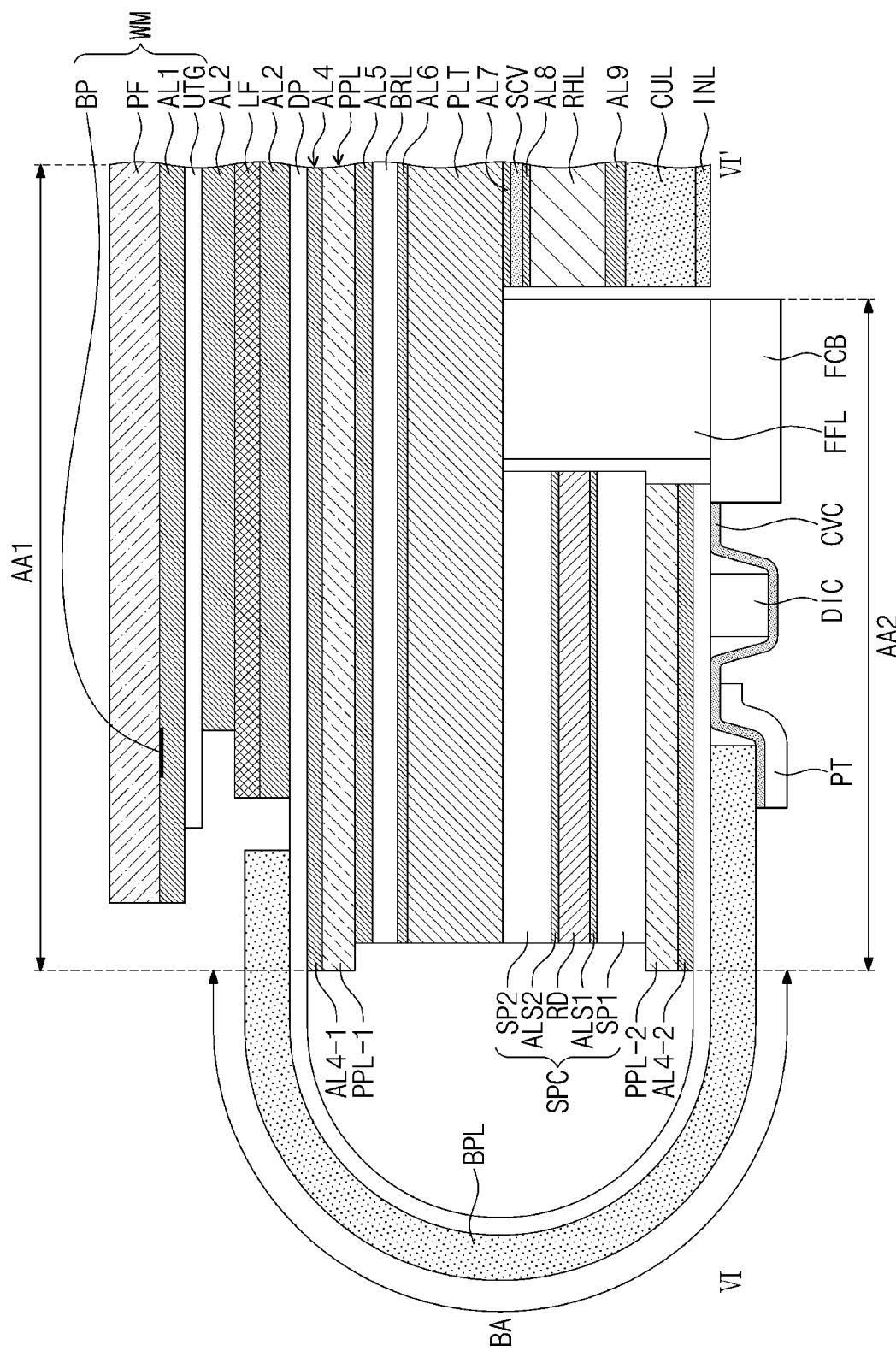

DISPLAY DEVICE

CROSS-REFERENCE TO RELATED APPLICATION(S)

This is a continuation application of U.S. patent application Ser. No. 17/317,290, filed May 11, 2021, now U.S. Pat. No. 11,791,235, the disclosure of which is incorporated herein by reference in its entirety. U.S. patent application Ser. No. 17/317,290 claims priority to and the benefit of Korean Patent Application No. 10-2020-0104065 under 35 U.S.C. § 119, filed Aug. 19, 2020, in the Korean Intellectual Property Office, the entire contents of which are incorporated herein by reference.

BACKGROUND

The disclosure herein relates to a display device, and more particularly, to a bendable display device.

Display devices include display areas that are activated according to electrical signals. The display devices may sense inputs applied from the outside through the display areas, and at the same time, may provide information to users by displaying various images. Recently, various forms of display devices are developed, and accordingly, display areas having various forms are being implemented.

SUMMARY

The disclosure provides a display device having improved heat radiation properties.

An embodiment of the disclosure provides a display device including a display panel including a first area, a bending area, and a second area arranged in a first direction and comprising a plurality of pixels disposed in the first area, a driving chip disposed on an upper surface of the second area of the display panel and electrically connected to the plurality of pixels, a support layer disposed on a lower surface of the first area of the display panel, and a spacer disposed on the lower surface of the first area of the display panel and overlapping the support layer in a plan view, wherein the spacer may include an upper layer, a lower layer, and a base layer disposed between the upper layer and the lower layer and having a thermal conductivity greater than a thermal conductivity of the upper layer and a thermal conductivity of the lower layer, and in case that the bending area of the display panel is folded, the spacer may overlap the driving chip in a plan view.

The base layer may include at least one of copper, a copper alloy, and graphite.

The support layer may include a metal.

The display device according to an embodiment of the disclosure may further include an adhesive layer disposed between the upper layer and the lower layer of the spacer, the base layer may include a plurality of openings passing through the base layer, and the adhesive layer may fill the plurality of openings.

The display device may further include an adhesive member disposed between the upper layer and the lower layer of the spacer to bond the upper layer and the lower layer of the spacer and having a closed loop shape surrounding the base layer of the spacer in a plan view.

In case that the display panel is folded, the spacer may be disposed between the first area and the second area of the display panel.

The spacer may overlap the second area of the display panel in a plan view.

The display device according to an embodiment of the disclosure may further include a heat radiation layer disposed on the lower surface of the first area of the display panel and spaced apart from the spacer in a plan view.

The heat radiation layer may overlap the support layer in a plan view.

The first area of the display panel may include a folding area which is foldable with respect to an axis defined in a second direction intersecting the first direction, and the support layer may include a plurality of openings in an area overlapping the folding area.

In an embodiment of the disclosure, a display device may include a display panel having a plurality of pixels, a driving chip electrically connected to the plurality of pixels, a spacer disposed on a lower surface of the display panel, the spacer comprising an upper layer, a lower layer, a base layer disposed between the upper layer and the lower layer and having a thermal conductivity greater than a thermal conductivity of the upper layer and a thermal conductivity of the lower layer, a first adhesive layer disposed between the upper layer and the base layer, and a second adhesive layer disposed between the lower layer and the base layer, and a support layer disposed between the spacer and the display panel and including a metal, wherein the driving chip may be movable so as to overlap the spacer or to be spaced apart from the spacer in a plan view.

The display panel may include a first area, a bending area, and a second area arranged in a first direction, the bending area is bendable, the plurality of pixels may be disposed on the first area, and the driving chip may be disposed on the second area, the driving chip may overlap the spacer in a plan view in case that the display panel is folded, and the driving chip may be spaced apart from the spacer in a plan view in case that the display panel is unfolded.

The display device according to an embodiment of the disclosure may further include a heat radiation layer disposed on a lower surface of the second area of the display panel, and the spacer may be spaced apart from the heat radiation layer in a plan view.

The display device according to an embodiment of the disclosure may further include a first protective layer disposed on a lower surface of the first area of the display panel, and a second protective layer disposed on the lower surface of the second area. The spacer may be disposed between the first protective layer and the second protective layer in case that the display panel is folded.

The base layer may include at least one of copper, a copper alloy, and graphite.

The upper layer and the lower layer each may include an insulating material.

The display device according to an embodiment of the disclosure may further include an adhesive member disposed between the upper layer and the lower layer to bond the upper layer and the lower layer.

The adhesive member may have a closed loop shape surrounding the base layer in a plan view.

The adhesive member may be thicker than the first adhesive layer.

The based layer may include a plurality of openings passing through the base layer, and the first adhesive layer and the second adhesive layer may contact each other through the plurality of openings.

BRIEF DESCRIPTION OF THE DRAWINGS

The accompanying drawings are included to provide a further understanding of the disclosure and are incorporated in and constitute a part of this specification. The drawings illustrate exemplary embodiments of the disclosure and, together with the description, serve to explain principles of the disclosure. In the drawings:

FIG. 7B is a schematic cross-sectional view of a display module according to an embodiment of the disclosure.

DETAILED DESCRIPTION OF THE EMBODIMENTS

Figure 1A:
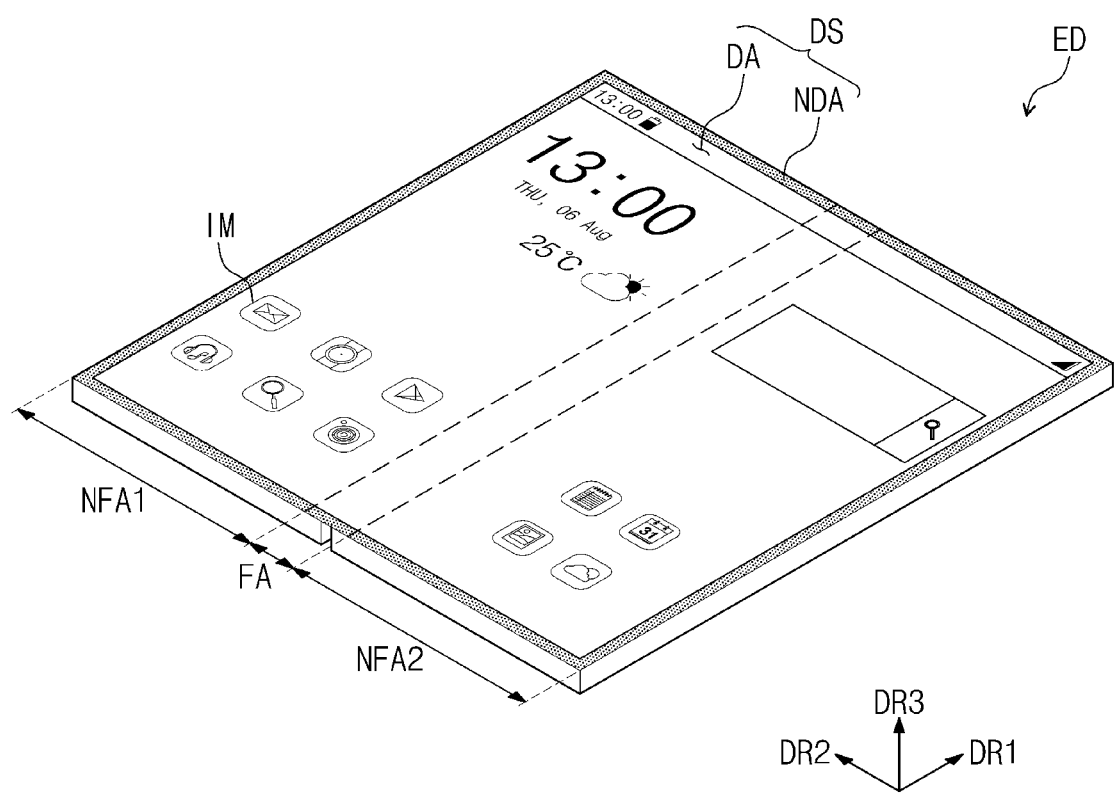
FIGS. 1A and 1B are schematic perspective views of an electronic device.

In the description, when an element (or a region, a layer, a portion, etc.) is referred to as being "on," "connected to," or "coupled to" another element, it means that the element may be directly disposed on, connected to, or coupled to the other element, or a third element may be disposed therebetween.

Like reference numerals refer to like elements. Also, in the drawings, the thickness, the ratio, and the dimensions of elements may be exaggerated for an effective description of technical contents. The term "and/or" includes all combinations of one or more of which associated configurations may define.

It will be understood that, although the terms "first", "second", or the like may be used herein to describe various elements, these elements should not be limited by these terms. These terms are only used to distinguish one element from another. For example, a first element could be termed a second element, and, similarly, a second element could be termed a first element, without departing from the scope of example embodiments of the disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise" or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used herein have the same meaning as commonly understood by one of ordinary skill in the art to which the disclosure pertains. It is also to be understood that terms, such as those defined in commonly used dictionaries, should be interpreted as having meanings consistent with the meanings in the context of the related art and the disclosure, and should not be interpreted in an ideal or excessively formal sense unless clearly so defined herein.

Hereinafter, embodiments of the disclosure will be described with reference to the accompanying drawings.

Figure 1B:
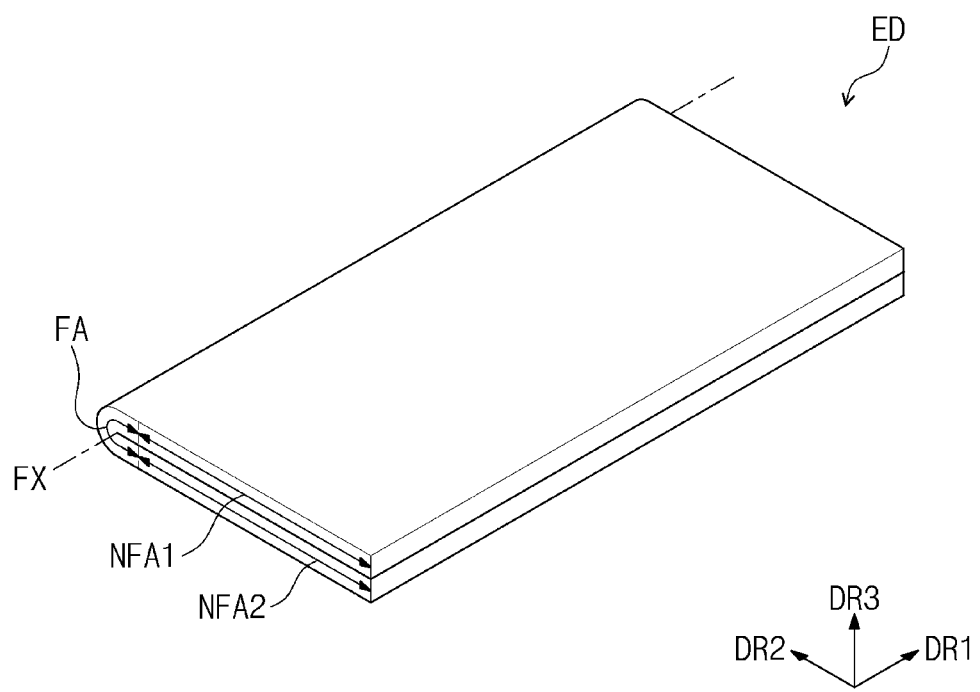

FIGS. 1A and 1B are schematic perspective views of an electronic device. FIG. 1A illustrates an unfolded state, and FIG. 1B illustrates a folded state.

Referring to FIGS. 1A and 1B, an electronic device ED according to an embodiment may include a display surface DS defined by a first direction DR1 and a second direction DR2 intersecting the first direction DR1. The electronic device ED may provide an image IM to users through the display surface DS.

The display surface DS may include a display area DA and a non-display area NDA around the display area DA. The display area DA may display the image IM, and the non-display area NDA may not display the image IM. The non-display area NDA may surround the display area DA. However, the embodiments are not limited thereto. For example, the shape of the display area DA and the shape of the non-display area NDA may be modified.

Hereinafter, a direction substantially perpendicular to a plane defined by the first direction DR1 and the second direction DR2 may be defined as a third direction DR3. In the description, "in a plan view" may be defined as viewed in the third direction DR3 from above. Hereinafter, the first to third directions DR1, DR2, and DR3 correspond to directions indicated by first to third directional axes, respectively, and are given like reference numerals.

The electronic device ED may include a folding area FA and non-folding areas NFA1 and NFA2. The non-folding areas NFA1 and NFA2 may include a first non-folding area NFA1 and a second non-folding area NFA2. In the second direction DR2, the folding area FA may be disposed between the first non-folding area NFA1 and the second non-folding area NFA2.

As shown in FIG. 1B, the folding area FA may be folded with respect to a folding axis FX parallel to the first direction DR1. The folding area FA may have a predetermined curvature and radius of curvature. The first non-folding area NFA1 and the second non-folding areas NFA2 may face each other, and the electronic device ED may be in-folded such that the display surface DS is not exposed to the outside.

In an embodiment, the electronic device ED may be out-folded such that the display surface DS is exposed to the outside. In an embodiment, the electronic device ED may be configured to repeat the operation of the in-folding or out-folding in turn from the operation of unfolding, but the embodiment is not limited thereto. In an embodiment, the electronic device ED may be configured to perform any one operation selected from among an unfolding operation, an in-folding operation, and an out-folding operation.

Figure 2A:
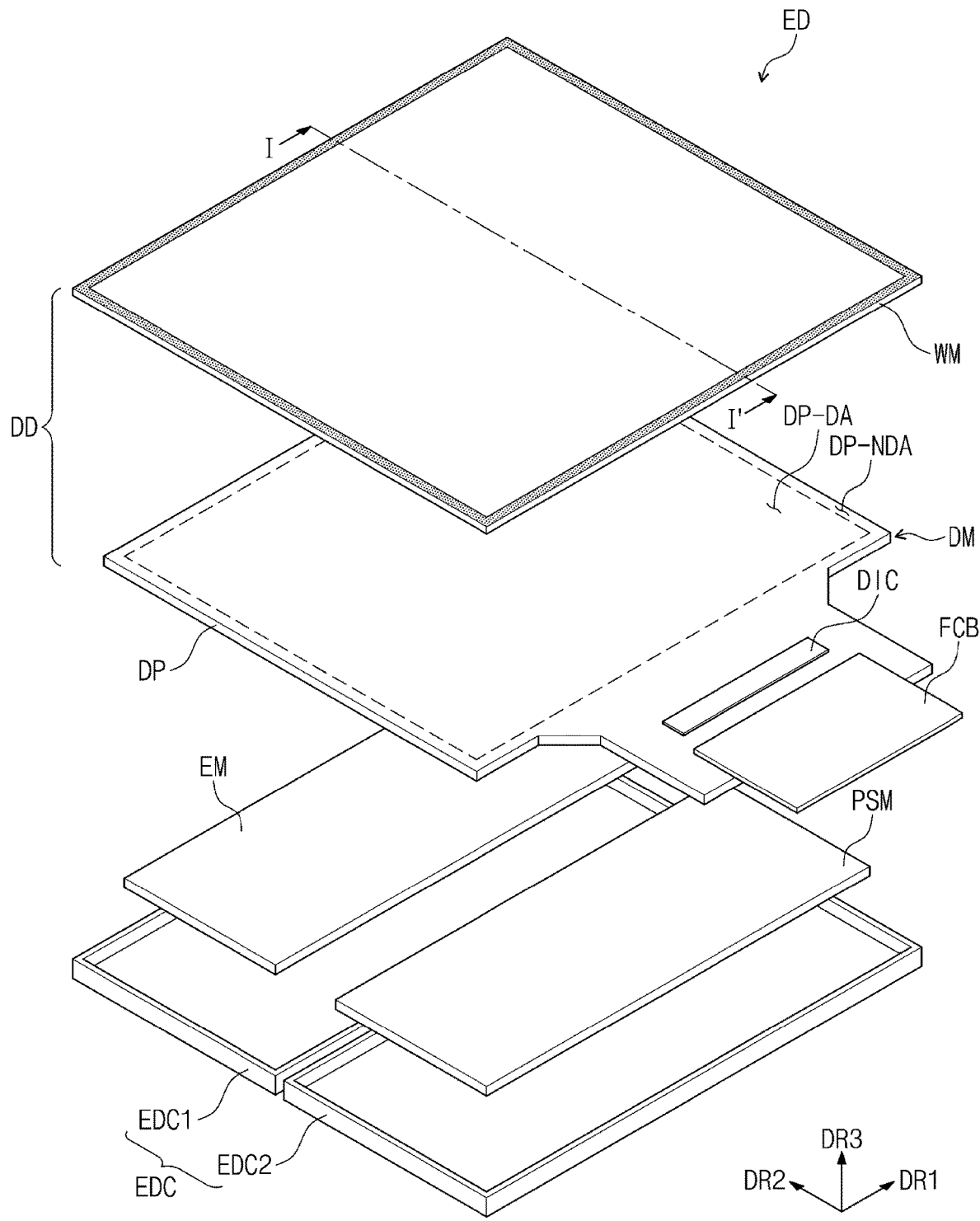
FIG. 2A is a schematic exploded perspective view of an electronic device according to an embodiment of the disclosure.
Figure 2B:
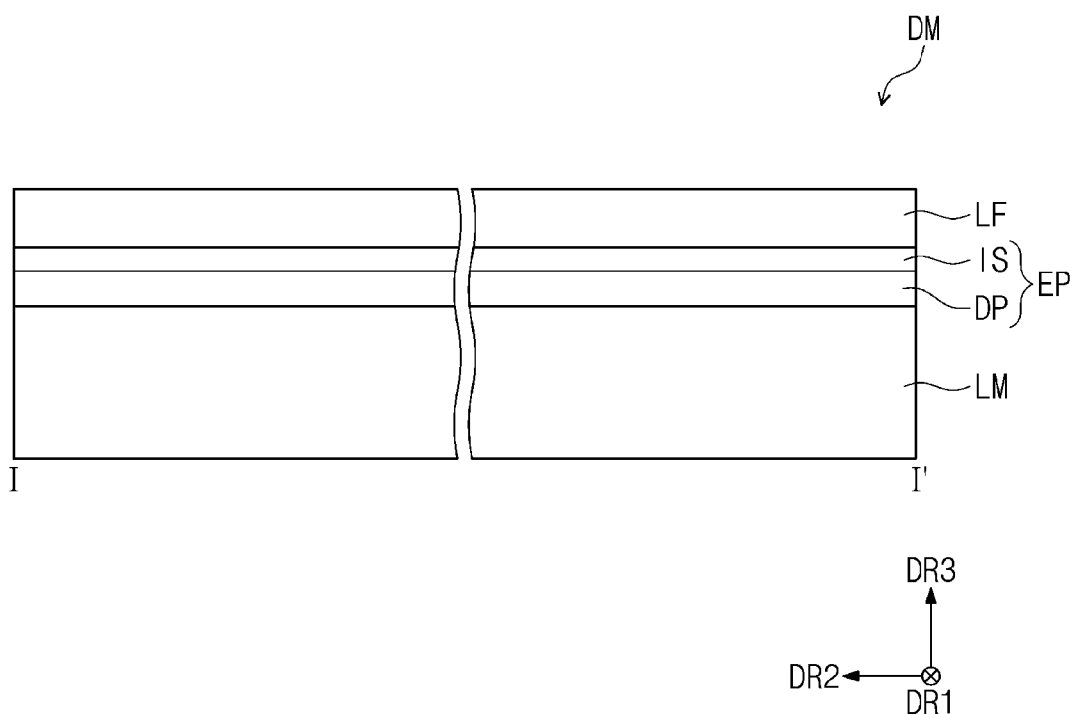
FIG. 2B is a schematic cross-sectional view of a display module according to an embodiment of the disclosure.
Figure 2C:
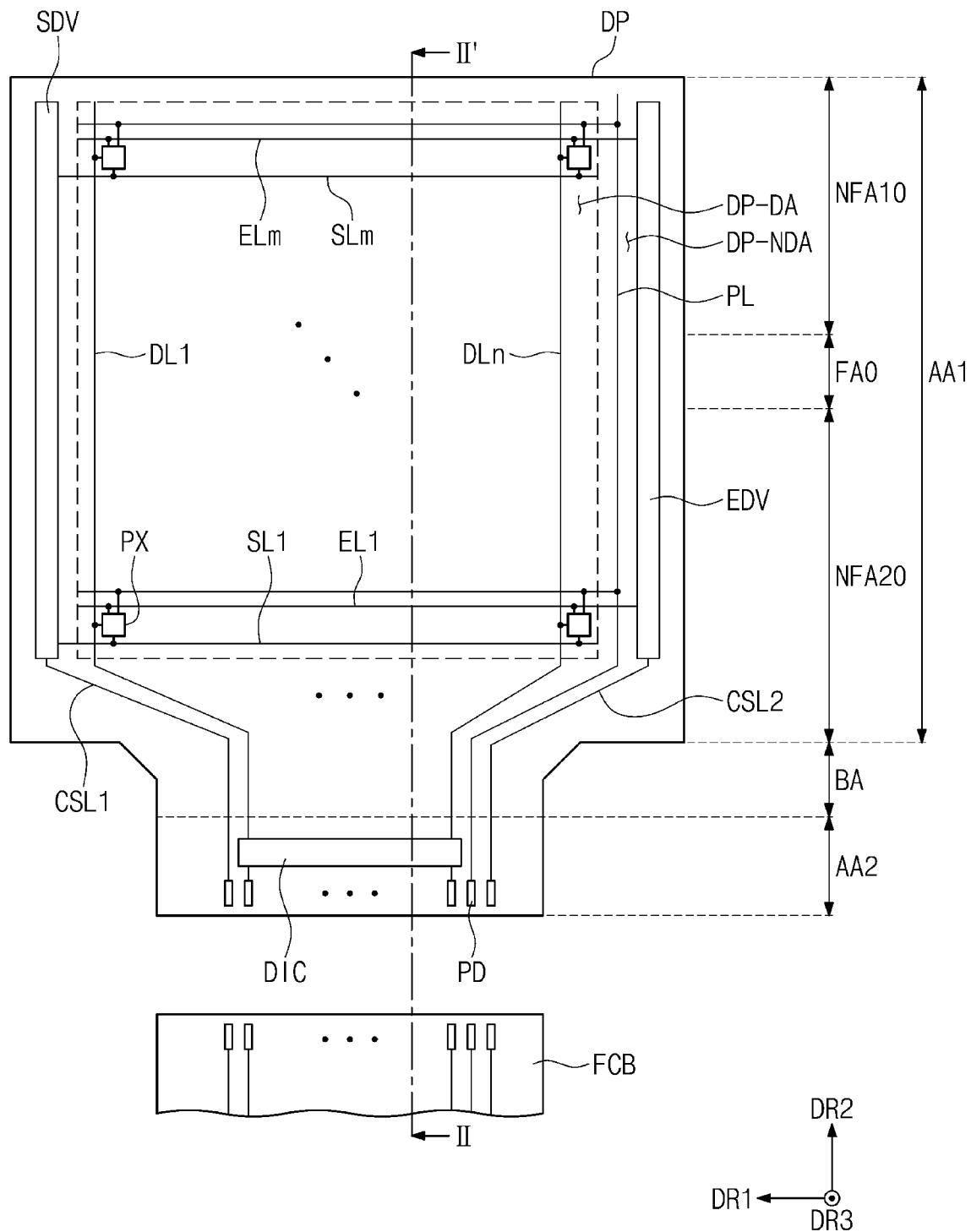
FIG. 2C is a schematic plan view of a display panel according to an embodiment of the disclosure.
Figure 2D:
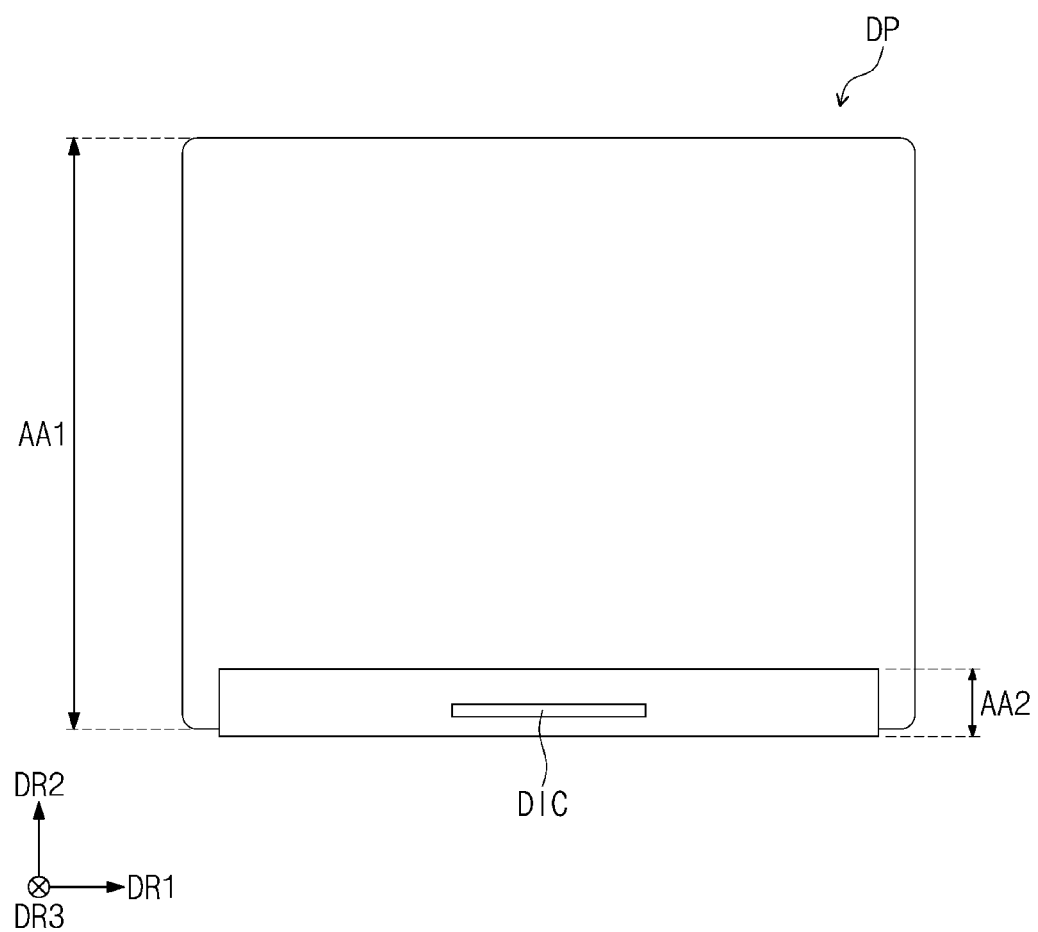
FIG. 2D is a schematic rear view of a display panel according to an embodiment of the disclosure.

FIG. 2A is a schematic exploded perspective view of an electronic device ED according to an embodiment. FIG. 2B is a schematic cross-sectional view of a display module DM according to an embodiment. FIG. 2C is a schematic plan view of a display panel DP according to an embodiment. FIG. 2D is a schematic rear view of a display panel according to an embodiment. FIG. 2B illustrates a cross section corresponding to line I-I' of FIG. 2A. FIG. 2C illustrates a display panel in an unfolded state, and FIG. 2D illustrates a display panel in a bent state. Hereinafter, the disclosure will be described with reference to FIGS. 2A to 2D.

As shown in FIG. 2A, the electronic device ED may include a display device DD, an electronic module EM, a power module PSM, and a case EDC. Although not shown separately, the power module PSM may further include a mechanical structure for controlling a folding operation of the display device DD.

The display device DD may generate an image and sense external inputs. The display device DD includes a window module WM and a display module DM. The window module WM provides a front surface of the electronic device ED.

The display module DM may include at least a display panel DP. FIG. 2A illustrates that the display module DM is substantially identical to the display panel DP, but substantially, the display module DM may be a stack structure in which multiple components are stacked.

The display panel DP includes a display area DP-DA corresponding to the display area DA (see FIG. 1A) of an electronic device ED and a non-display area DP-NDA corresponding to the non-display area NDA (see FIG. 1A). In the description, if an area/portion "correspond to" another area/portion may mean that the area/portion and the other area/portion are overlapping and are not limited to being disposed in the same area. The display module DM may include a driving chip DIC disposed in the non-display area DP-NDA. The display module DM may further include a flexible circuit film FCB bonded to the non-display area DP-NDA.

The driving chip DIC may include driving elements, for example, a data driving circuit, for driving pixels of the display panel DP. FIG. 2A illustrates a structure in which the driving chip DIC is mounted on the display panel DP, but the embodiment is not limited thereto. For example, the driving chip DIC may be mounted on the flexible circuit film FCB. A bending area BA (see FIG. 2C) of the display panel DP may be omitted, and as the flexible circuit film FCB is bent, the driving chip DIC may be disposed on a spacer SPC (see FIG. 3B) which will be described below. As a portion of the display panel DP or the flexible circuit film FCB is bent, the driving chip DIC according to an embodiment may be mounted in various locations if disposed in an area overlapping the spacer SPC disposed on a rear surface of the display panel DP, but the embodiments are not limited to thereto.

The electronic module EM may include at least a main controller. The electronic module EM may include a wireless communication module, a camera module, a proximity sensor module, an image input module, an audio input module, an audio output module, a memory, an external interface, or the like. Those modules may be mounted on the circuit board or may be electrically connected through a flexible circuit board. The electronic module EM may be electrically connected to the power module PSM.

The main controller may control the overall operation of the electronic device ED. For example, the main controller may activate or deactivate the display device DD. The main controller may control the operation of the display device DD and other modules. The main controller may include at least one microprocessor.

The cases EDC1 and EDC2 may accommodate the display module DM, the electronic module EM, and the power module PSM. FIG. 2A illustrates two cases EDC1 and EDC2 separated from each other as an example, but the embodiment is not limited thereto. Although not shown, the electronic device ED may further include a hinge structure for connecting the two cases EDC1 and EDC2. The cases EDC1 and EDC2 may be combined with the window module WM. The case EDC including the cases EDC1 and EDC2 may protect the components accommodated in the case EDC, such as the display module DM, the electronic module EM, and the power module PSM.

Referring to FIG. 2B, the display module DM may include a display panel DP, an input sensor IS disposed on the display panel DP, an optical film LF disposed on the input sensor IS, and a lower member LM disposed under (or at a lower side of) the display panel DP. An adhesive layer may be disposed between the members as desired.

The display panel DP may include a base layer, a circuit element layer disposed on the base layer, a display element layer disposed on the circuit element layer, and a thin film encapsulation layer disposed on the display element layer. The base layer may include a plastic film. For example, the base layer may include a polyimide.

The circuit element layer may include an organic layer, an inorganic layer, a semiconductor pattern, a conductive pattern, a signal line, or the like. An organic layer, an inorganic layer, a semiconductor layer, and a conductive layer may be formed on the base layer by methods such as coating and vapor deposition. Thereafter, the organic layer, the inorganic layer, the semiconductor layer, and the conductive layer may be selectively patterned by photolithography processes to form a semiconductor pattern, a conductive pattern, and a signal line.

The semiconductor pattern, the conductive pattern, and the signal line may form a pixel driving circuit of pixels PX shown in FIG. 2C, which will be described below, and signal lines SL1 to SLm, DL1 to DLn, EL1 to ELm, CSL1, CSL2, and PL. The pixel driving circuit may include at least one transistor.

The display element layer may include a light emitting element (or light emitting diode) among the components of the pixels PX shown in FIG. 2C. The light emitting element may be electrically connected to the at least one transistor. The thin film encapsulation layer may be disposed on the circuit element layer to seal the display element layer. The thin film encapsulation layer may include an inorganic layer, an organic layer, and an inorganic layer, which are sequentially stacked. The stack structure of the thin film encapsulation layer is not particularly limited.

Referring to FIG. 2C, the display panel DP will be described in detail. FIG. 2C illustrates pixels PX, signal lines SL1 to SLm, DL1 to DLn, EL1 to ELm, CSL1, CSL2, and PL, a scan driver SDV, and a driving chip DIC, and a light emitting driver EDV among the components of the display panel DP.

The pixels PX may include a light emitting element and a thin film transistor electrically connected to the light emitting element. The shape of the display panel DP shown in FIG. 2C may be substantially identical to the shape the base layer described above in a plan view. In the embodiment, the display area DP-DA and the non-display area DP-NDA may be defined according to whether the light emitting element is arranged.

FIG. 2C illustrates that the pixels PX are disposed in the display area DP-DA. However, this is illustrated as an example, and some of the pixels PX may include thin film transistors disposed in the non-display area DP-NDA, and the embodiments are not limited thereto.

The scan driver SDV, the driving chip DIC, and the light emitting driver EDV may be disposed in the non-display area DP-NDA. The driving chip DIC may include a data driver.

The display panel DP may include a first area AA1, a second area AA2, and a bending area BA divided in the second direction DR2. The second area AA2 and the bending area BA may be a partial area of the non-display area DP-NDA. The bending area BA may be disposed between the first area AA1 and the second area AA2.

The first area AA1 may be an area corresponding to the display surface DS of FIG. 1A. The first area AA1 may include a first non-folding area NFA10, a second non-folding area NFA20, and a folding area FA0. The first non-folding area NFA10, the second non-folding area NFA20, and the folding area FA0 may correspond to the first non-folding area NFA1, the second non-folding area NFA2, and the folding area FA of FIGS. 1A and 1B, respectively.

Lengths of the bending area BA and the second area AA2 in the first direction DR1 may be smaller than the length of the first area AA1 in the first direction DR1. The areas having smaller lengths in a bending axis direction may be bent more easily.

The signal lines SL1 to SLm, DL1 to DLn, EL1 to ELm, CSL1, CSL2, and PL may include scan lines SL1 to SLm, data lines DL1 to DLn, light emitting lines EL1 to ELm, first and second control lines CSL1 and CSL2, and a power line PL. Among the signal lines SL1 to SLm, DL1 to DLn, EL1 to ELm, CSL1, CSL2, and PL, the data lines DL1 to DLn, the first and second control lines CSL1 and CSL2, and the power line PL each may be electrically connected to pads PD. In this case, m and n are natural numbers. The pixels PX may be electrically connected to the scan lines SL1 to SLm, the data lines DL1 to DLn, and the light emitting lines EL1 to ELm.

The scan lines SL1 to SLm may extend in the first direction DR1 to be electrically connected to the scan driver SDV. The data lines DL1 to DLn may extend in the second direction DR2 to be electrically connected to the driving chip DIC via the bending area BA. The light emitting lines EL1 to ELm may extend in the first direction DR1 to be electrically connected to the light emitting driver EDV.

The power line PL may include a portion extending in the second direction DR2 and a portion extending in the first direction DR1. The portion extending in the first direction DR1 of the power line PL and the portion extending in the second direction DR2 of the power line PL may be disposed on different layers. A portion of the power line PL extending in the second direction DR2 may extend to the second area AA2 via the bending area BA. The power line PL may provide a first voltage to the pixels PX.

The first control line CSL1 may be electrically connected to the scan driver SDV and may extend towards a lower end of the second area AA2 via the bending area BA. The second control line CSL2 may be electrically connected to the light emitting driver EDV and may extend towards the lower end of the second area AA2 via the bending area BA.

In a plan view, the pads PD may be disposed adjacent to the lower end of the second area AA2. The driving chip DIC, the power line PL, the first control line CSL1, and the second control line CSL2 may be electrically connected to the pads PD. The flexible circuit film FCB may be electrically connected to the pads PD through an anisotropic conductive adhesive layer.

Referring to FIG. 2D, the bending area BA may be bent towards the rear surface of the display panel DP. In case that the display panel DP is bent, the second area AA2 and the rear surface of the display panel DP may face the same direction. Accordingly, the driving chip DIC may be viewed in the front surface of the display panel DP in case that the display panel DP is not bent, but may be viewed in the rear surface of the display panel DP in case that the display panel DP is bent.

According to the disclosure, an increase in the non-display area NDA of the display device DD as much as an area of the second area AA2 or the bending area BA may be prevented because the bending area BA of the display panel DP may be bent. Accordingly, the display device DD having a narrow bezel may be provided.

Referring back to FIG. 2B, the input sensor IS may be disposed on the display panel DP. The input sensor IS may include sensing electrodes (not shown) for sensing external inputs, trace lines (not shown) electrically connected to the sensing electrodes, and an inorganic layer and/or an organic layer for insulating and/or protecting the sensing electrodes or the trace lines. The input sensor IS may be a capacitive sensor but is not limited thereto.

When the display panel DP is manufactured, the input sensor IS may be directly formed on a thin film encapsulation layer by a continuous process. In the description, a display panel DP integrated with an input sensor IS may be defined as an electronic panel EP. However, the embodiment is not limited thereto, and the input sensor IS may be manufactured as a panel separate from the display panel DP and may be attached to the display panel DP by an adhesive layer.

The sensing electrodes may overlap the display area DP-DA. The trace lines may be disposed to overlap the non-display area DP-NDA. The trace lines may extend towards the lower end of the second area AA2 via the bending area BA so as to be adjacent to the pad PD, which will be described below. In this case, the trace lines may be disposed on a different layer from the signal lines SL1 to SLm, DL1 to DLn, EL1 to ELm, CSL1, CSL2, and PL of the circuit element layer.

The trace lines may be electrically connected to signal lines (input signal lines) provided for the input sensor IS of the display panel DP in the first area AA1. The input signal lines may be signal lines different from the signal lines SL1 to SLm, DL1 to DLn, EL1 to ELm, CSL1, CSL2, and PL of the circuit element layer, but may be disposed on the same layer as any one of them. The input signal lines each may be electrically connected to a corresponding pad PD. As a result, the trace lines and the signal lines of the circuit element layer may be electrically connected to the same flexible circuit film FCB.

The optical film LF may reduce the reflectance of external light. The optical film LF may include a phase retarder and/or a polarizer. The optical film LF may include at least a polarizing film.

The lower member LM may include various functional members. Examples of various functional members may include a light-shielding layer for blocking light incident on the display panel DP, a shock absorbing layer for absorbing external shocks, a support layer for supporting the display panel DP, and a heat radiation layer for emitting heat generated from the display panel DP. The stack structure of the lower member LM is not particularly limited.

Figure 3A:
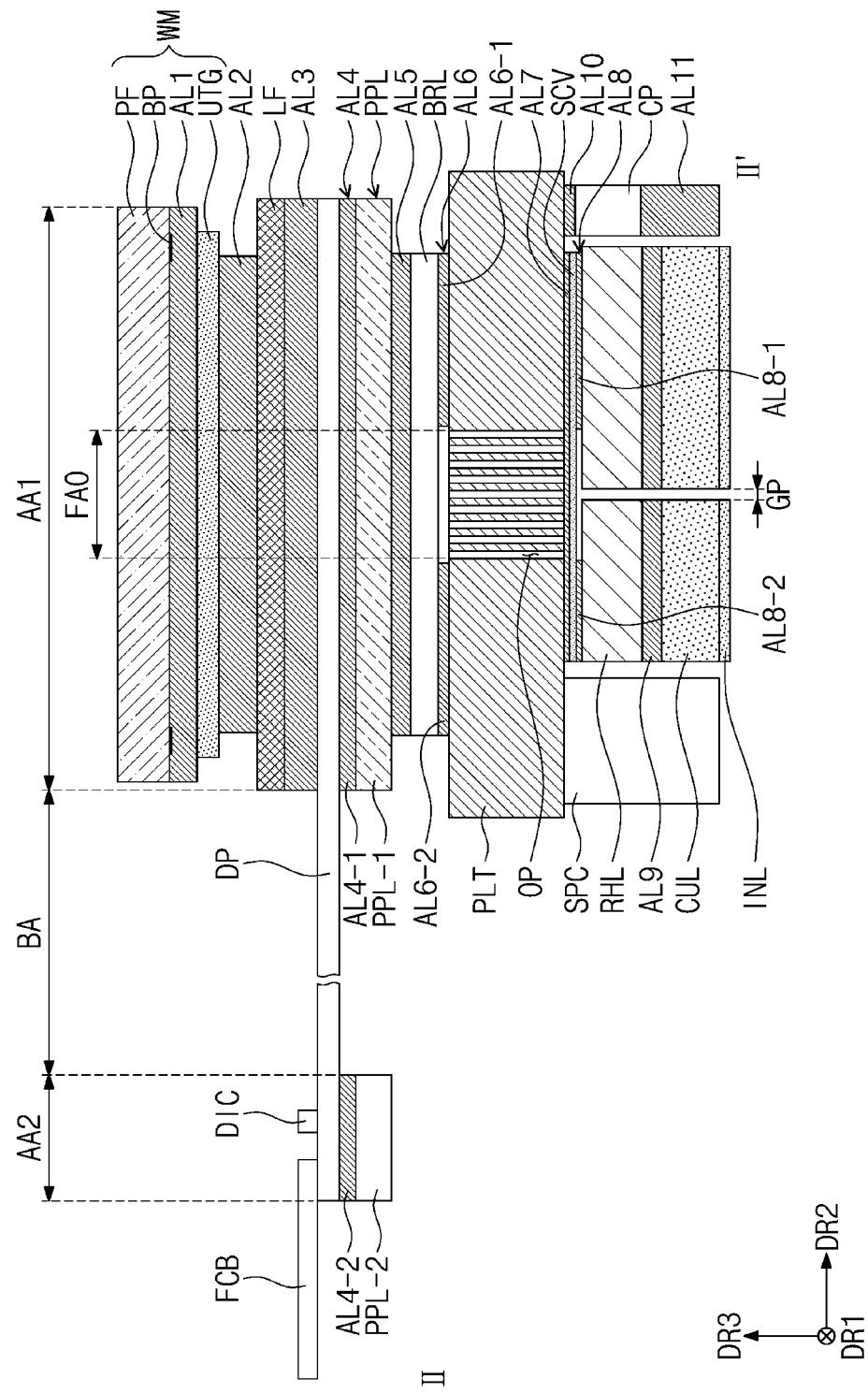
FIG. 3A is a schematic cross-sectional view of a display device according to an embodiment of the disclosure.
Figure 3B:
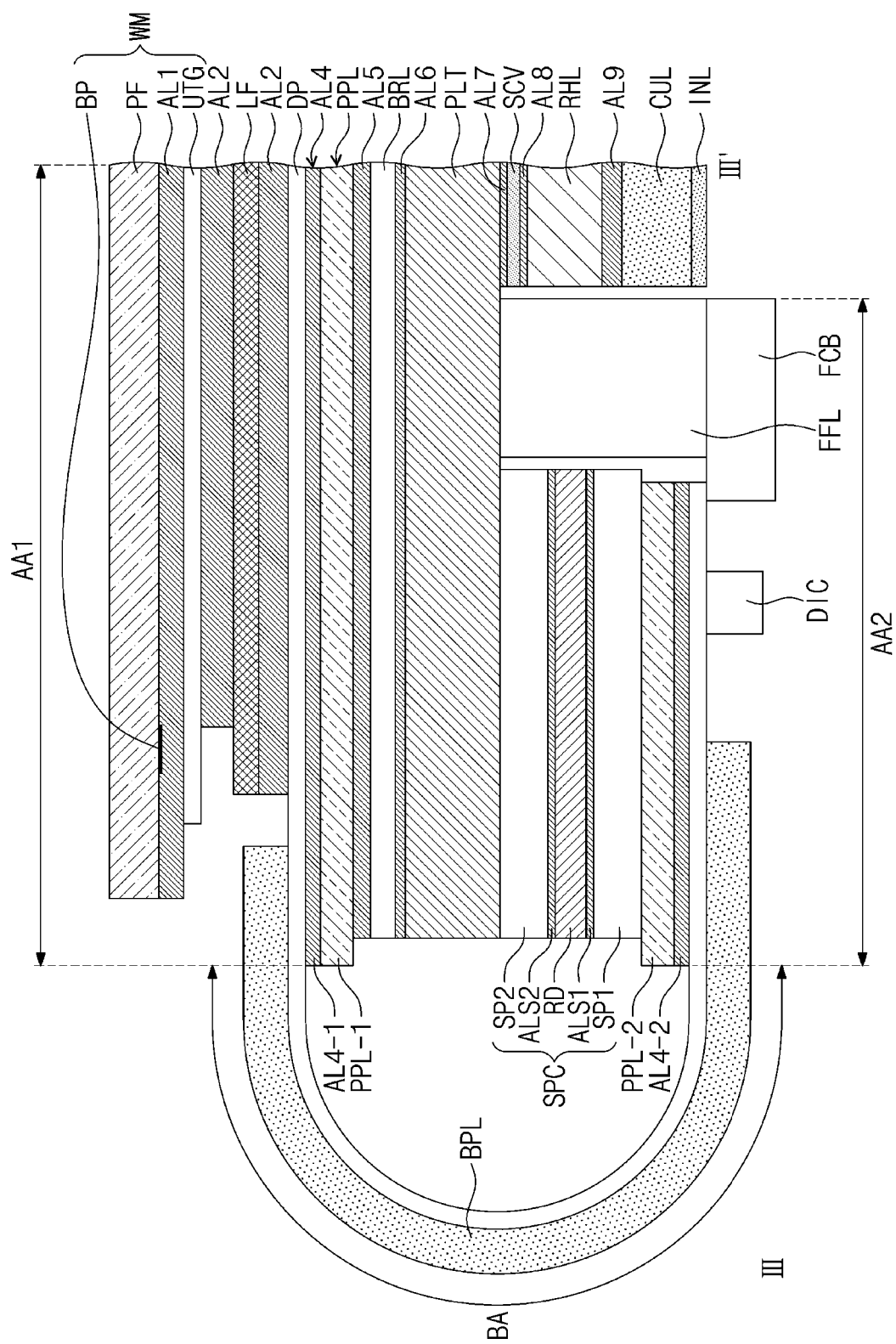
FIG. 3B is a schematic cross-sectional view of a display device according to an embodiment of the disclosure.
Figure 4A:
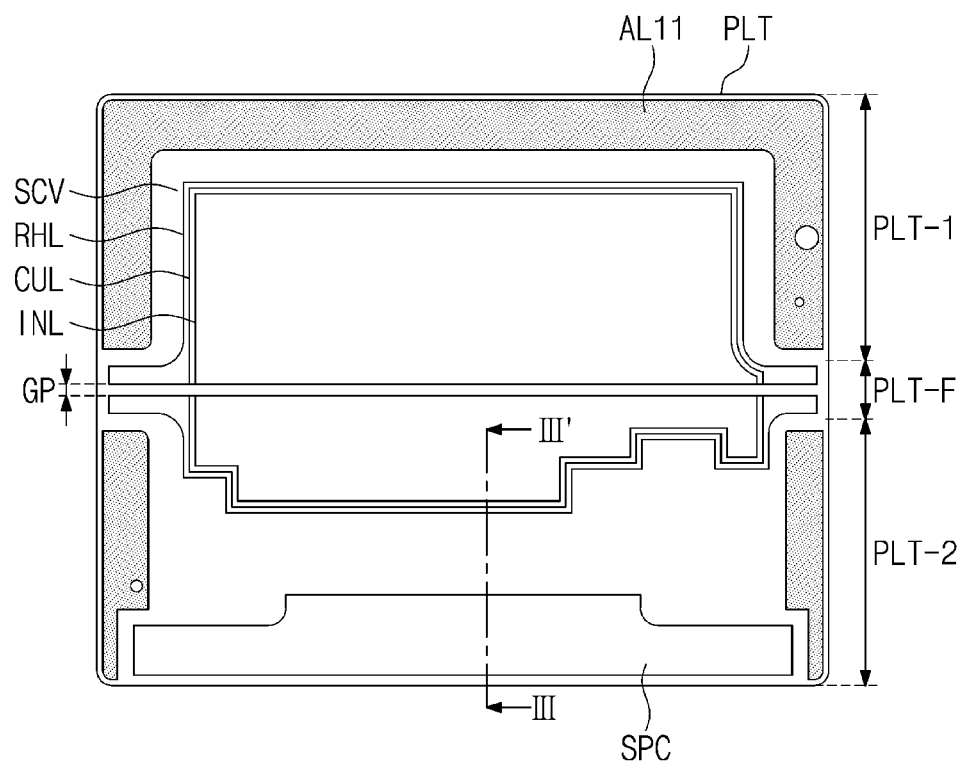
FIG. 4A is a schematic rear view of a display device according to an embodiment of the disclosure.
Figure 4B:
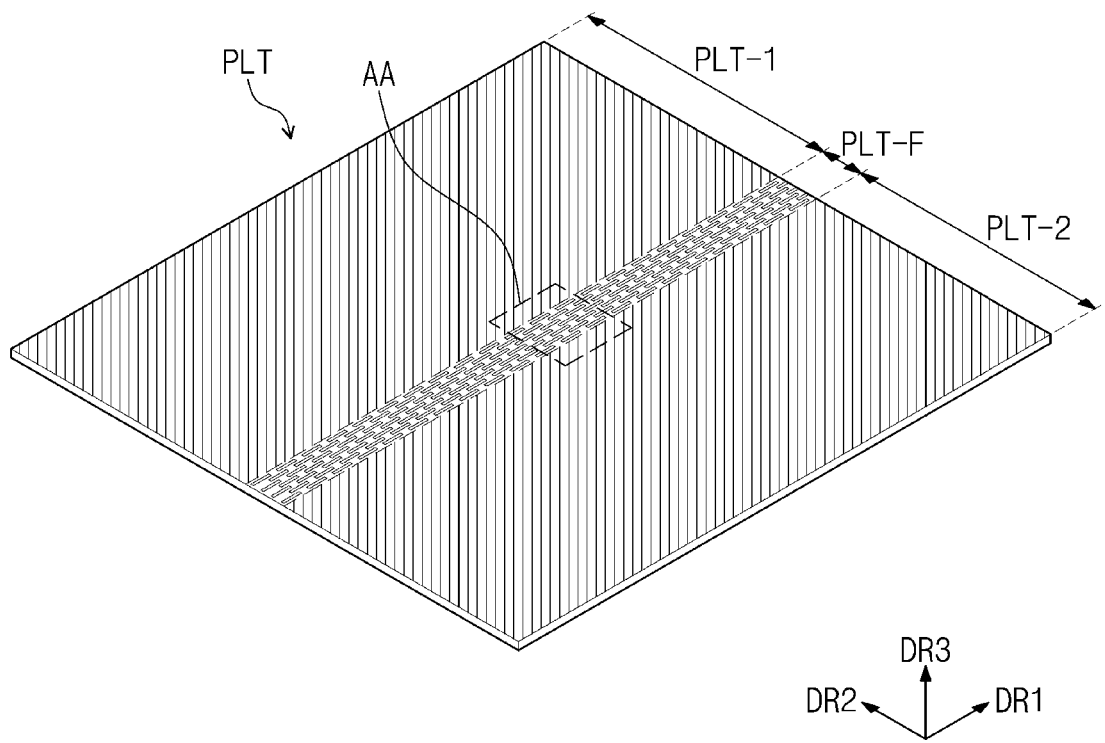
FIG. 4B is a schematic plan view of a support layer according to an embodiment of the disclosure.
Figure 4C:
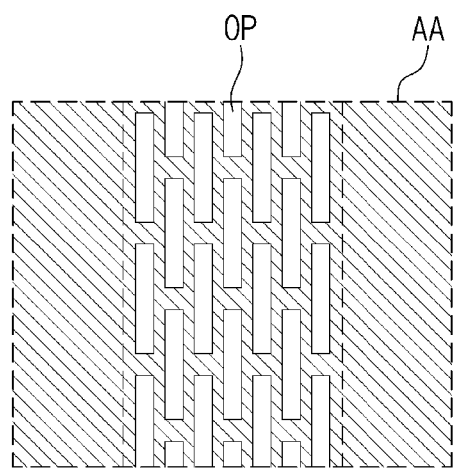
FIG. 4C is a schematic enlarged plan view of area AA of FIG. 4B.

FIG. 3A is a schematic cross-sectional view of a display device according to an embodiment. FIG. 3B is a schematic cross-sectional view of a display device according to an embodiment. FIG. 4A is a schematic rear view of a display device. FIG. 4B is a schematic plan view of a support layer according to an embodiment. FIG. 4C is schematic enlarged plan view of FIG. 4B. FIG. 3A illustrates a display device in a state where a display panel is folded, and FIG. 3B illustrates a display device in a state where a display panel is bent. FIG. 3A illustrates a cross section corresponding to line II-II' of FIG. 2C. FIG. 3B illustrates a cross section corresponding to line III-III' of FIG. 4A. FIG. 4A may correspond to a schematic rear view of the display device shown in FIG. 3A. Hereinafter, the disclosure will be described with reference to FIGS. 3A to 4C.

Referring to FIGS. 3A and 3B, the display device DD may include a window module WM and a display module DM. The window module WM may include a thin glass substrate UTG, a plastic film PF, an adhesive layer AL1 (hereinafter referred to as a first adhesive layer), and a bezel pattern BP.

The bezel pattern BP may overlap the non-display area DP-NDA shown in FIG. 2A. The bezel pattern BP may be disposed on a surface of the thin glass substrate UTG or on a surface of the plastic film PF. In the embodiment, the bezel pattern BP disposed on a lower surface (or a rear surface) of the plastic film PF is illustrated as an example. The embodiment is not limited thereto, and the bezel pattern BP may be disposed on an upper surface of the plastic film PF. The bezel pattern BP may be a colored light blocking film and may be formed by, for example, a coating method. The bezel pattern BP may include a base material and a dye or pigment mixed with the base material.

The thin glass substrate UTG may have a thickness of about 15 μm to about 45 μm. The thin glass substrate UTG may be chemically tempered glass. The thin glass substrate UTG may minimize the generation of wrinkles even in case that folding and unfolding thereof are repeated.

The plastic film PF may be disposed on the thin glass substrate UTG. The plastic film PF may have a thickness of about 50 μm to about 80 μm. The plastic film PF may include polyimide, polycarbonate, polyamide, triacetylcellulose, polymethylmethacrylate, or polyethylene terephthalate. Although not shown separately, at least one of a hard coating layer, an anti-fingerprint layer, and an anti-reflection layer may be disposed on an upper surface of the plastic film PF.

The first adhesive layer AL1 may bond the thin glass substrate UTG and the plastic film PF. The first adhesive layer AL1 may include a pressure sensitive adhesive (PSA) or an optically clear adhesive (OCA). Adhesive layers which will be described below may be substantially identical the first adhesive layer AL1 and may include a conventional adhesive.

The first adhesive layer AL1 may be separated from the thin glass substrate UTG. The plastic film PF has a lower strength than the thin glass substrate UTG, and thus scratches may relatively easily occur thereon. After the first adhesive layer AL1 and the plastic film PF are separated from the thin glass substrate UTG, a new plastic film PF may be attached to the thin glass substrate UTG.

The display module DM may include an optical film LF, a display panel DP, a panel protection layer PPL, a barrier layer BRL, a support layer PLT, a cover layer SCV, a heat radiation layer RHL, a cushion layer CUL, an insulating layer INL, a spacer SPC, a step compensation pattern CP, and second to eleventh adhesive layers AL2 to AL11. The second to eleventh adhesive layers AL2 to AL11 may include a transparent adhesive such as a pressure sensitive adhesive or an optically clear adhesive. Some of the components described above in an embodiment may be omitted. For example, the step compensation pattern CP and the tenth and eleventh adhesive layers AL10 and AL11 related thereto may be omitted.

The optical film LF may be disposed in the first area AA1 shown in FIG. 2C. The optical film LF may cover or overlap at least the display area DP-DA. The second adhesive layer AL2 may bond the optical film LF and the window module WM, and the third adhesive layer AL3 may bond the optical film LF and the display panel DP. FIGS. 3A and 3B only illustrate the display panel DP, but the input sensor IS may be further disposed between the display panel DP and the third adhesive layer AL3 as the electronic panel EP shown in FIG. 2B.

The panel protection layer PPL may be disposed under or at a lower side of the display panel DP. The panel protection layer PPL may protect a lower portion of the display panel DP. The panel protection layer PPL may include a flexible plastic material. For example, the panel protection layer PPL may include polyethylene terephthalate. In an embodiment, the panel protection layer PPL may not be disposed in the folding area FA. The fourth adhesive layer AL4 may bond the panel protection layer PPL and the display panel DP, and the fifth adhesive layer AL5 may bond the panel protection layer PPL and the barrier layer BRL.

The panel protection layer PPL may include a first panel protection layer PPL-1 for protecting the first area AA1 of the display panel DP, and a second panel protection layer PPL-2 for protecting the second area AA2. In case that the bending area BA is bent, the second panel protection layer PPL-2 may be disposed below or under the first area AA1 and the first panel protection layer PPL-1 along with the second area AA2. The panel protection layer PPL may not be disposed in the bending area BA, and the bending area BA may thus be more easily bent. The fourth adhesive layer AL4 may include a first portion AL4-1 corresponding to the first panel protection layer PPL-1, and a second portion AL4-2 corresponding to the second panel protection layer PPL-2.

The barrier layer BRL may be disposed under the panel protection layer PPL. The barrier layer BRL may increase resistance to a compressive force due to external pressing. Accordingly, the barrier layer BRL may prevent deformation of the display panel DP. The barrier layer BRL may include a flexible plastic material such as polyimide or polyethylene terephthalate. The barrier layer BRL may be a colored film having a low light transmittance. The barrier layer BRL may absorb light incident from the outside. For example, the barrier layer BRL may be a black plastic film. When the display device DD is viewed from above the window module WM, the components disposed under the barrier layer BRL may not be viewed by users. The fifth adhesive layer AL5 may bond the panel protection layer PPL and the barrier layer BRL, and the sixth adhesive layer AL6 may bond the barrier layer BRL and the support layer PLT.

The support layer PLT may be disposed under the barrier layer BRL. The support layer PLT may include a material having an elastic modulus of about 60 GPa or greater. The support layer PLT may include a metal material such as stainless steel. For example, the support layer PLT may include SUS 304, but the embodiments are not limited thereto, and the support layer PLT may include various metal materials. The support layer PLT may support the display panel DP. The heat radiation performance of the display device DD may be improved at least in part because of the support layer PLT.

Openings OP may be defined in a partial area of the support layer PLT corresponding to the folding area FA0. The flexibility of the support layer PLT may be improved at least in part because of the openings OP. The sixth adhesive layer AL6 may include a first portion AL6-1 and a second portion AL6-2 spaced apart from each other. The flexibility of the support layer PLT may be improved by not disposing the sixth adhesive layer AL6 in an area corresponding to the folding area FA0.

Referring to FIGS. 4B and 4C, the support layer PLT will be described in detail. The support layer PLT may include a folding area PLT-F corresponding to the folding area FA0 shown in FIG. 3A, a first area PLT-1 corresponding to the first non-folding area NFA10, and a second area PLT-2 corresponding to the second non-folding area NFA20. The openings OP may be formed in the folding area PLT-F.

The openings OP may be arranged by a predetermined rule. The openings OP may be arranged in the form of a grid. The openings OP may be formed in the folding area PLT-F, thereby reducing the area of the folding area PLT-F to lower the stiffness of the folding area PLT-F. Accordingly, the folding area PLT-F may have a higher flexibility than the case where the openings OP are not formed therein.

Referring back to FIGS. 3A and 3B, the seventh adhesive layer AL7 may bond the support layer PLT and the cover layer SCV, and the eighth adhesive layer AL8 may bond the cover layer SCV and the heat radiation layer RHL. The cover layer SCV may cover or overlap the openings OP defined in the support layer PLT. The cover layer SCV may have a lower elastic modulus than the support layer PLT. For example, the cover layer SCV may include thermoplastic polyurethane, rubber, and silicone, but the embodiments are not limited thereto.

The cover layer SCV may be prepared in the form of a sheet and attached to the support layer PLT. The eighth adhesive layer AL8 may include a first portion AL8-1 and a second portion AL8-2 spaced apart from each other. Flexibility of the cover layer SCV may be improved by not disposing the eighth adhesive layer AL8 in an area corresponding to the folding area FA0.

The heat radiation layer RHL may be a sheet having high thermal conductivity. The heat radiation layer RHL may include at least one of copper, a copper alloy, and graphite. The ninth adhesive layer AL9 may bond the heat radiation layer RHL and the cushion layer CUL.

The cushion layer CUL may absorb external shocks to protect the display panel DP. The cushion layer CUL may include a foam sheet having a predetermined elasticity. The cushion layer CUL may include sponge or polyurethane.

The insulating layer INL may be disposed under the cushion layer CUL. An example in which an insulating tape is disposed is shown. The insulating layer INL may prevent the inflow of static electricity. Although not shown in FIG. 3B, the flexible circuit film FCB shown in FIG. 3A may be disposed on the insulating layer INL in the state where the display panel DP is bent. The insulating layer INL may prevent electrical interference from occurring between the flexible circuit film FCB and members disposed on the insulating layer INL.

The heat radiation layer RHL, the ninth adhesive layer AL9, the cushion layer CUL, and the insulating layer INL each may include two portions spaced apart from each other with a predetermined gap GP therebetween. The gap GP may be about 0.3 mm to about 3 mm and may be disposed to correspond to the folding area FA0.

When viewed from the rear surface of the display panel DP, a conductive film FFL may be disposed between the spacer SPC and the heat radiation layer RHL. The conductive film FFL may be attached to the flexible circuit film FCB. The conductive film FFL may contact each of the flexible circuit film FCB and the support layer PLT. Static electricity generated in the flexible circuit film FCB may be diffused and dispersed into the support layer PLT through the conductive film FFL. Accordingly, electrical reliability of the flexible circuit film FCB may be improved. However, this is presented as an example, and in another embodiment, the conductive film FFL may be omitted.

A surface of the step compensation pattern CP may be bonded to the support layer PLT by the tenth adhesive layer AL10. The eleventh adhesive layer AL11 may be disposed on another surface of the step compensation pattern CP. The eleventh adhesive layer AL11 may be used in case that the display device DD is bonded to other components of an electronic device ED (see FIG. 1). The lower member LM shown in FIG. 2B may include a stack structure from the fourth insulating layer AL4 to the insulating layer INL of FIG. 3A.

Referring to FIGS. 3A and 3B, the bending area BA may be bent such that the second area AA2 is disposed under the first area AA1. Accordingly, the driving chip DIC may be disposed under the first area AA1. For example, the first area AA1 and the second area AA2 may be disposed on different planes (or reference planes). The bending area BA may be bent to be convex in the horizontal direction in a cross-sectional view. The bending area BA may have a predetermined curvature and a predetermined radius of curvature. The radius of curvature may be about 0.1 mm to about 0.5 mm.

The bending protection layer BPL may be disposed at least in the bending area BA. The bending protection layer BPL may overlap the bending area BA, the first area AA1, and the second area AA2. The bending protection layer BPL may be disposed in a portion of the first area AA1 and a portion of the second area AA2.

The bending protection layer BPL and the bending area BA may be bent. The bending protection layer BPL may protect the bending area BA from external shocks and may control a neutral plane of the bending area BA. The bending protection layer BPL may control the stress of the bending area BA such that the neutral plane is closer to the signal lines (e.g., SL1 to SLm, DL1 to DLn, EL1 to ELm, CSL1, CSL2, and PL) disposed in the bending area BA.

A surface of the second panel protection layer PPL-2 to which the second portion AL4-2 of the fourth adhesive layer AL4 is not attached may be attached to the spacer SPC. The spacer SPC may prevent excessive bending of the display panel DP and may allow the display panel DP to be bent while keeping a predetermined curvature.

FIG. 3B illustrates a detailed stack structure of the spacer SPC. The spacer SPC may include a lower layer SP1, an upper layer SP2, a base layer RD, a first spacer adhesive layer ALS1, and a second spacer adhesive layer ALS2.

The lower layer SP1 and the upper layer SP2 may disposed to be spaced apart from each other with the base layer RD therebetween in a cross-sectional view. The lower layer SP1 and the upper layer SP2 each may be formed of an insulating material. For example, the lower layer SP1 and the upper layer SP2 each may include a polymer material such as polyethylene terephthalate (PET), polycarbonate (PC), or polyurethane (PU). The lower layer SP1 and the upper layer SP2 each may be rigid or elastic, and the embodiments are not limited thereto.

The lower layer SP1 may be disposed to be farther spaced apart from the support layer PLT than the upper layer SP2. In case that the display panel DP is bent, the lower layer SP1 may be disposed between the base layer RD and the second panel protection layer PPL-2. The upper layer SP2 may be disposed on the lower surface (or the rear surface) of the support layer PLT. Although not shown, the upper layer SP2 may be bonded to the support layer PLT by a predetermined adhesive layer.

The base layer RD may be disposed between the lower layer SP1 and the upper layer SP2. The base layer RD may include a material having high heat radiation properties. For example, the base layer RD may be formed of a material having high thermal conductivity. For example, the base layer RD may include at least one of graphite, copper, and a copper alloy. However, the embodiments are not limited thereto. For example, the base layer RD may include various materials as long as the materials have higher heat radiation properties than the lower layer SP1 or the upper layer SP2. However, the embodiments are not limited thereto.

The first spacer adhesive layer ALS1 and the second spacer adhesive layer ALS2 each may include a transparent adhesive such as a pressure sensitive adhesive or an optically clear adhesive. The first spacer adhesive layer ALS1 may be disposed between the lower layer SP1 and the base layer RD. The first spacer adhesive layer ALS1 may bond the lower layer SP1 and the base layer RD. The second spacer adhesive layer ALS2 may be disposed between the upper layer SP2 and the base layer RD to bond the upper layer SP2 and the base layer RD.

According to the disclosure, the spacer SPC may be disposed in an area overlapping the driving chip DIC in a plan view. In the process of operating the display device DD, high heat may be generated from the driving chip DIC. The heat generated from the driving chip DIC may be dissipated by moving to the support layer PLT through the spacer SPC. Accordingly, deterioration of the driving chip DIC may be prevented, and thus reliability of the display device DD may be improved.

FIG. 4A may be a schematic view of a support layer PLT when viewed from the rear surface thereof. A cover layer SCV, a heat radiation layer RHL, a cushion layer CUL, an insulating layer INL, and a spacer SPC may be disposed on the lower surface of the support layer PLT. This stack structure may be disposed in a partial area of the lower surface of the support layer PLT. The cover layer SCV may overlap the folding area PLT-F. It is shown that the areas of the cover layer SCV, the heat radiation layer RHL, the cushion layer CUL, and the insulating layer INL decrease in the stated order, but the embodiments are not limited thereto. The spacer SPC is disposed to be spaced apart from the stack structure. Referring to FIG. 4A, the spacer SPC may be disposed outside the stack structure and disposed along an edge of the support layer PLT.

In case that the display panel DP is bent, the conductive film FFL attached to the flexible circuit film FCB may be disposed in an area exposed from the cover layer SCV, the heat radiation layer RHL, the cushion layer CUL, the insulating layer INL, and the spacer SPC on the support layers PLT. Accordingly, the flexible circuit film FCB may be supported by the conductive film FFL in an area not overlapping the spacer SPC.

The spacer SPC may be disposed to overlap the support layer PLT in a plan view. As described above, the heat generated from the driving chip DIC may be diffused through the base layer RD of the spacer SPC, and the heat transferred to the spacer SPC may be dispersed through the support layer PLT. Accordingly, the spacer SPC may prevent deterioration of the driving chip DIC while supporting the bent display panel DP, thereby improving the thermal reliability of the display device DD.

According to the disclosure, the driving chip DIC may emit heat through the spacer SPC, and the heat radiation layer RHL may thus not overlap the driving chip DIC. According to the disclosure, the heat radiation layer RHL may include an area spaced apart from the driving chip DIC to overlap only an area where the driving chip DIC is not present. Accordingly, an excessive increase in an area of the heat radiation layer RHL may be prevented, and the weight of the display module DM may be reduced, thereby improving portability of a display device DD.

Figure 5A:
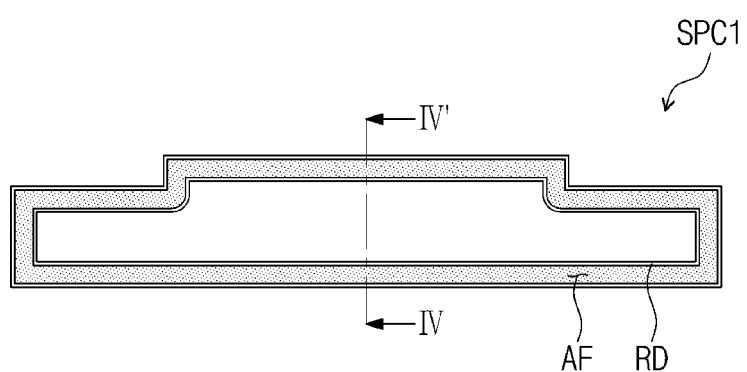
FIG. 5A is a schematic plan view of a spacer according to an embodiment of the disclosure.
Figure 5B:
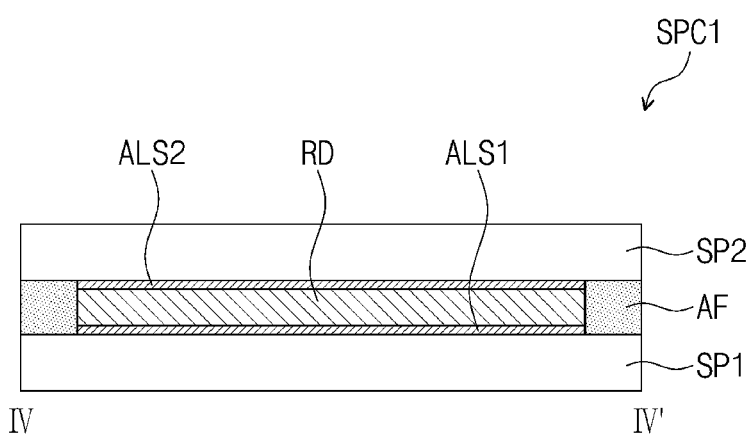
FIG. 5B is a schematic cross-sectional view taken along line IV-IV' shown in FIG. 5A.
Figure 6A:
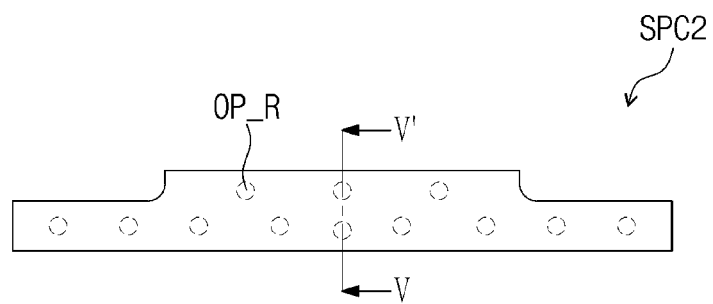
FIG. 6A is a schematic plan view of a spacer according to an embodiment of the disclosure.
Figure 6B:
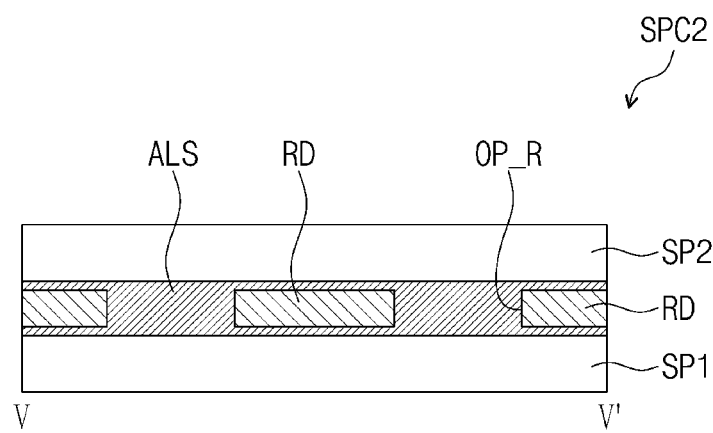
FIG. 6B is a schematic cross-sectional view taken along line V-V' shown in FIG. 6A.

FIG. 5A is a schematic plan view of a spacer according to an embodiment. FIG. 5B is a schematic cross-sectional view taken along line IV-IV' shown in FIG. 5A. FIG. 6A is a schematic plan view of a spacer according to an embodiment. FIG. 6B is a schematic cross-sectional view taken along line V-V' shown in FIG. 6A. Hereinafter, spacers SPC1 and SPC2 will be described with reference to FIGS. 5A to 6B.

As shown in FIGS. 5A and 5B, the spacer SPC1 may further include an adhesive member AF. The adhesive member AF may be disposed along edges of the upper layer SP1 and the lower layer SP2 in a plan view and may have a closed loop shape surrounding the base layer RD.

The adhesive member AF may have a greater thickness than that of the first spacer adhesive layer ALS1 or the second spacer adhesive layer ALS2. For example, the adhesive member AF may have a thickness corresponding to the sum of the thicknesses of the first spacer adhesive layer ALS1, the second spacer adhesive layer ALS2, and the base layer RD.

The adhesive member AF may have adhesiveness. The adhesive member AF may include a pressure sensitive adhesive (PSA) or an optically clear adhesive (OCA), but the type of the adhesive is not limited thereto. The adhesive member AF may be provided in the form of a tape or in the form of liquid. However, the embodiments are not limited thereto.

According to the disclosure, the spacer SPC1 may further include the adhesive member AF, thereby supplementing adhesion among the base layer RD, the upper layer SP1, and the lower layer SP2. The spacer SPC1 may block external exposure of the base layer RD, thereby easily preventing defective peeling or stripping defects between the base layer RD and the upper layer SP1 or between the base layer RD and the lower layer SP2.

As another example, as shown in FIGS. 6A and 6B, in the spacer SPC2, openings OP_R may be formed in the base layer RD. The openings OP_R may be defined through the base layer RD. An adhesive layer ALS may fill the openings OP_R. The adhesive layer ALS may correspond to a form (or structure) in which the first spacer adhesive layer ALS1 (see FIG. 3B) and the second spacer adhesive layer ALS2 (see FIG. 3B) contact each other through the openings OP_R to be integral with each other.

The adhesive layer ALS may pass through the openings OP_R to bond the upper layer SP1 and the lower layer SP2. Accordingly, bonding force among the base layer RD, the upper layer SP1, and the lower layer SP2 may be improved, and an interlayer peeling defects in the spacer SPC2 may be improved.

Figure 7A:
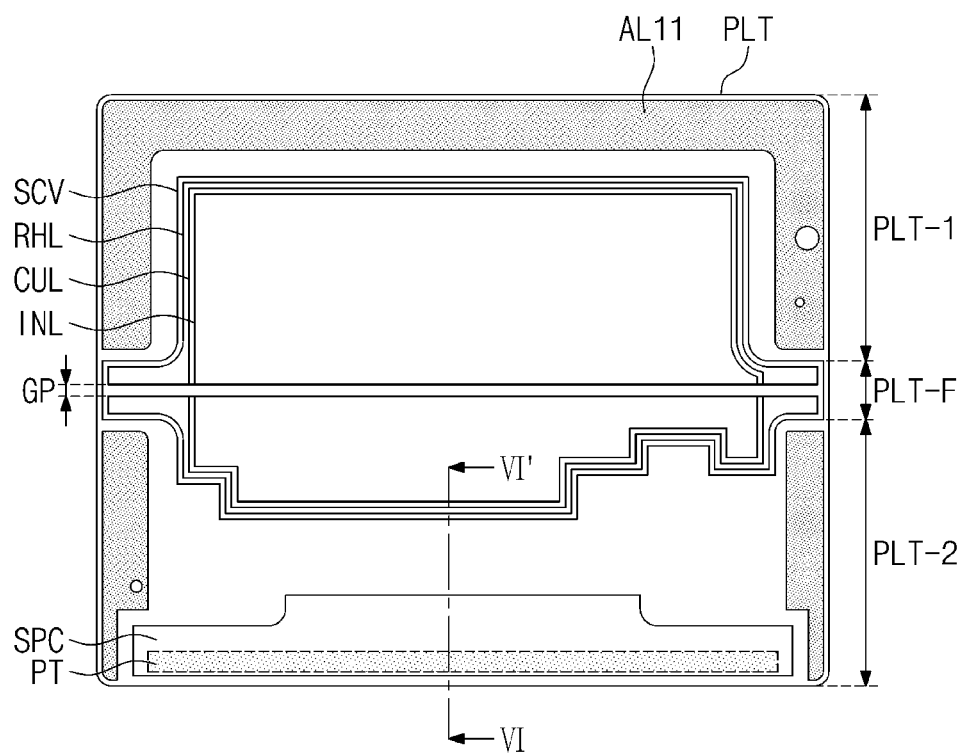
FIG. 7A is a schematic rear view of a display device according to an embodiment of the disclosure.

FIG. 7A is a schematic rear view of a display device according to an embodiment. FIG. 7B is a schematic cross-sectional view of a display module according to an embodiment. FIG. 7A illustrates a support layer PLT when viewed from the rear surface of the support layer PLT, and FIG. 7B illustrates an area taken along line VI-VI' illustrated in FIG. 7A. Hereinafter, the disclosure will be described with reference to FIGS. 7A and 7B. Like reference numerals denote like components, and repetitive descriptions will be omitted.

As shown in FIGS. 7A and 7B, a display module DM may further include a support film PT. The support film PT may be disposed under the support layer PLT. In the embodiment, the support film PT may be disposed in the second area PLT-2 of the support layer PLT and may be disposed to overlap the spacer SPC. The support film PT is shown to have a shape not overlapping the cover layer SCV, the heat radiation layer RHL, the cushion layer CUL, the insulating layer INL, and the eleventh adhesive layer AL11 in a plan view.

The support film PT may be disposed on a cover film CVC. The cover film CVC may be disposed on the display panel DP to cover or overlap a portion of the bending protection layer BPL and the driving chip DIC. The cover film CVC may block external exposure of the driving chip DIC and signal lines of the display panel DP (not shown). This is presented as an example, and in the display module DM according to an embodiment, the cover film CVC may be omitted, and the support film PT may be directly disposed on the display panel DP.

The support film PT may protect the cover film CVC. The support film PT is disposed so as not to overlap the driving chip DIC in a plan view. The support film PT may prevent external shocks from being applied to the driving chip DIC. Although not shown, the support film PT may include a base film and an adhesive disposed on a surface of the base film.

The support film PT may be a release film. Accordingly, the support film PT may be bonded to the cover film CVC or the support layer PLT to facilitate detachment from and attachment to the cover film CVC or the support layer PLT.

According to the disclosure, heat generated from the driving chip may be dispersed to prevent deterioration of a driving chip. Therefore, the reliability of a display device may be improved. According to the disclosure, portability of the display device may be enhanced by reducing the weight of the display device.

Although the disclosure has been described with reference to some embodiments, it will be understood that the disclosure should not be limited to these embodiments, but various changes and modifications can be made by those skilled in the art without departing from the spirit and scope of the disclosure. Therefore, the technical scope of the disclosure is not intended to be limited to the contents set forth in the detailed description of the specification, and the claimed invention shall be defined by the appended claims.

What is claimed is:

1. A display device comprising:
    a display panel including a first area, a bending area, and a second area arranged in a first direction, and comprising a plurality of pixels disposed in the first area;
    a driving chip disposed on an upper surface of the second area of the display panel and electrically connected to the plurality of pixels;
    a support layer disposed on a lower surface of the first area of the display panel, the support layer having at least one of openings penetrating the support layer in a cross-sectional view; and
    a spacer disposed on the lower surface of the first area of the display panel and overlapping the support layer in plan view, wherein
    the spacer comprises:
        an upper layer;
        a lower layer; and
        a base layer disposed between the upper layer and the lower layer and having a thermal conductivity greater than a thermal conductivity of the upper layer and a thermal conductivity of the lower layer, and
    in case that the bending area of the display panel is bent, the spacer overlaps the driving chip in plan view.

2. The display device of claim 1, the spacer further comprising:
    a first adhesive layer disposed between the upper layer and the based layer;
    a second adhesive layer disposed between the lower layer and the base layer; and
    the support layer disposed between the spacer and the display panel and including a metal.

3. The display device of claim 2, wherein
    each of the upper layer and the lower layer includes an insulating material, and
    the support layer has a thermal conductivity greater than the thermal conductivity of the upper layer.

4. The display device of claim 2, wherein
    the base layer comprises a plurality of openings passing through the base layer, and
    the adhesive layers fill the plurality of openings.

5. The display device of claim 2, further comprising an adhesive member disposed between the upper layer and the lower layer of the spacer to bond the upper layer and the lower layer of the spacer, and having a closed loop shape surrounding the base layer of the spacer in plan view.

6. The display device of claim 1, wherein in case that the display panel is bent, the spacer is disposed between the first area and the second area of the display panel.

7. The display device of claim 6, wherein the spacer overlaps the second area of the display panel in plan view.

8. The display device of claim 1, further comprising a heat radiation layer disposed on the lower surface of the first area of the display panel and spaced apart from the spacer in plan view.

9. The display device of claim 8, wherein the heat radiation layer overlaps the support layer in plan view.

10. The display device of claim 1, wherein
    the first area of the display panel comprises a folding area which is foldable with respect to an axis defined in a second direction intersecting the first direction, and
    the support layer comprises a plurality of openings in an area overlapping the folding area.

11. The display device of claim 1, wherein the base layer comprises at least one of copper, a copper alloy, and graphite.

12. The display device of claim 11, wherein the support layer comprises a metal.

* * * * *